(12) United States Patent
Horiuchi

(10) Patent No.: US 8,451,657 B2
(45) Date of Patent: May 28, 2013

(54) NONVOLATILE SEMICONDUCTOR MEMORY DEVICE USING MIS TRANSISTOR

(75) Inventor: Tadahiko Horiuchi, Kanagawa (JP)

(73) Assignee: NSCore, Inc., Fukuoka (JP)

( * ) Notice: Subject to any disclaimer, the term of this patent is extended or adjusted under 35 U.S.C. 154(b) by 271 days.

(21) Appl. No.: 13/026,720

(22) Filed: Feb. 14, 2011

(65) Prior Publication Data

US 2012/0206960 A1    Aug. 16, 2012

(51) Int. Cl.
*G11C 11/34*    (2006.01)

(52) U.S. Cl.
USPC .......................... 365/184; 365/177; 365/182

(58) Field of Classification Search
USPC .......................................... 365/177, 182, 184
See application file for complete search history.

(56) References Cited

U.S. PATENT DOCUMENTS

| | | | |
|---|---|---|---|
| 3,636,530 A | 1/1972 | Mark et al. | |
| 4,419,744 A | 12/1983 | Rutter | |
| 5,768,192 A | 6/1998 | Eitan | |
| 5,956,269 A | 9/1999 | Ouyang et al. | |
| 6,038,168 A | 3/2000 | Allen et al. | |
| 6,064,590 A | 5/2000 | Han et al. | |
| 6,335,554 B1 | 1/2002 | Yoshikawa | |
| 6,642,586 B2 | 11/2003 | Takahashi | |
| 6,740,927 B1 | 5/2004 | Jeng | |
| 6,906,953 B2 | 6/2005 | Forbes | |
| 6,906,962 B2 | 6/2005 | Layman et al. | |
| 6,909,635 B2 | 6/2005 | Forbes et al. | |
| 7,151,706 B2 | 12/2006 | Nakamura | |
| 7,227,234 B2 | 6/2007 | Roizin et al. | |
| 2004/0232477 A1 | 11/2004 | Iwata et al. | |
| 2004/0252554 A1 | 12/2004 | Fournel et al. | |
| 2006/0193174 A1 | 8/2006 | Choi et al. | |
| 2010/0080038 A1* | 4/2010 | Awaya et al. ................. | 365/148 |
| 2011/0116332 A1* | 5/2011 | Naka et al. .................... | 365/201 |
| 2011/0292735 A1* | 12/2011 | Oyama .................... | 365/185.21 |

FOREIGN PATENT DOCUMENTS

| | | |
|---|---|---|
| JP | 06-076582 | 3/1994 |
| JP | 06-231587 | 8/1994 |
| JP | 2001-156188 | 6/2001 |
| JP | 2002-237540 | 8/2002 |
| WO | WO2004/057621 | 7/2004 |
| WO | WO2006/093629 | 9/2006 |

\* cited by examiner

*Primary Examiner* — Hoai V Ho
(74) *Attorney, Agent, or Firm* — IPUSA, PLLC

(57) ABSTRACT

A nonvolatile semiconductor memory device includes an MIS transistor having nodes, a control circuit configured to apply a first set of potentials to the nodes to cause an irreversible change in transistor characteristics, to apply a second set of potentials to the nodes to cause a first current to flow through the MIS transistor in a first direction, and to apply the second set of potentials to the nodes to cause a second current to flow through the MIS transistor in a second direction opposite the first direction, and a sense circuit configured to produce a signal responsive to a difference between the first current and the second current.

10 Claims, 21 Drawing Sheets

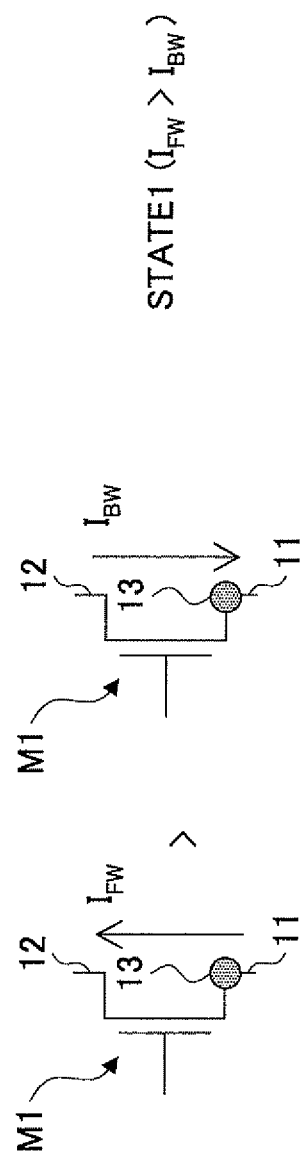

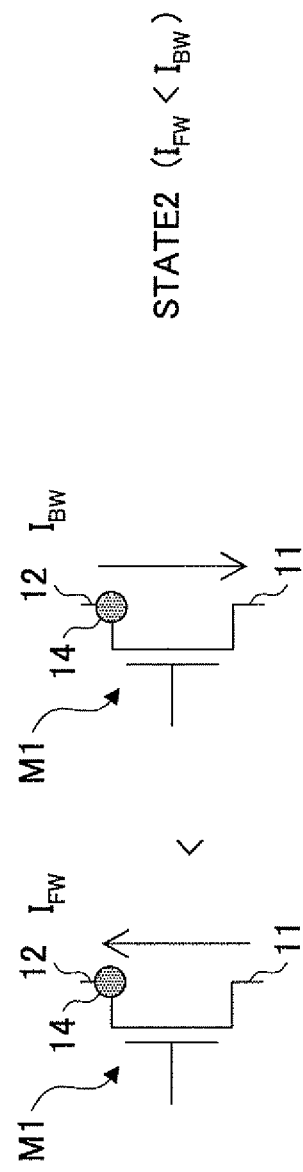

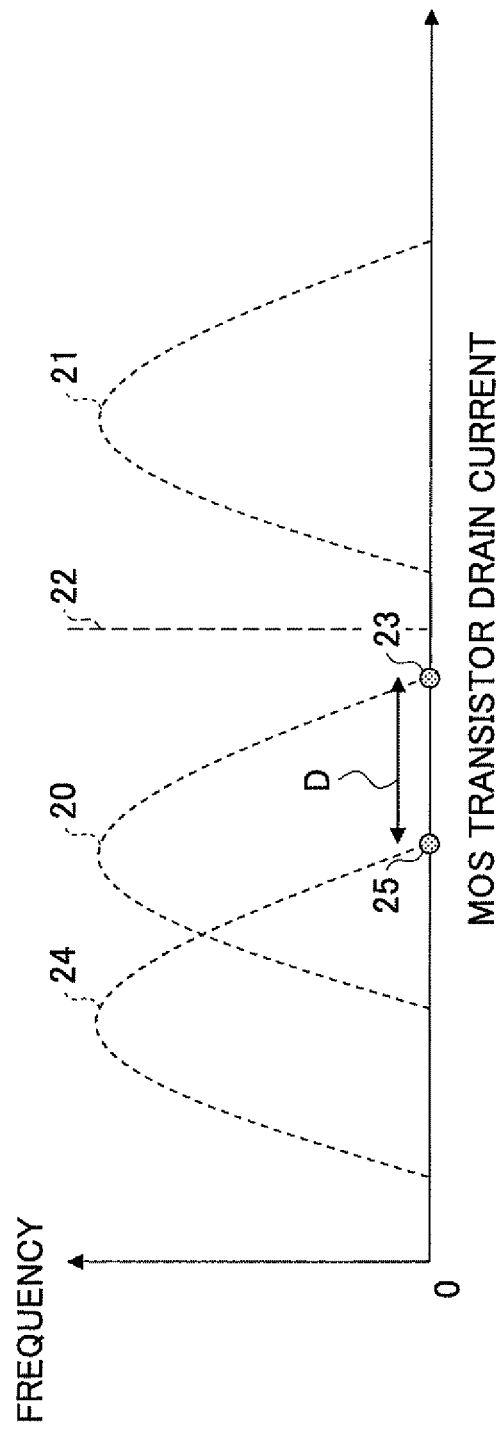

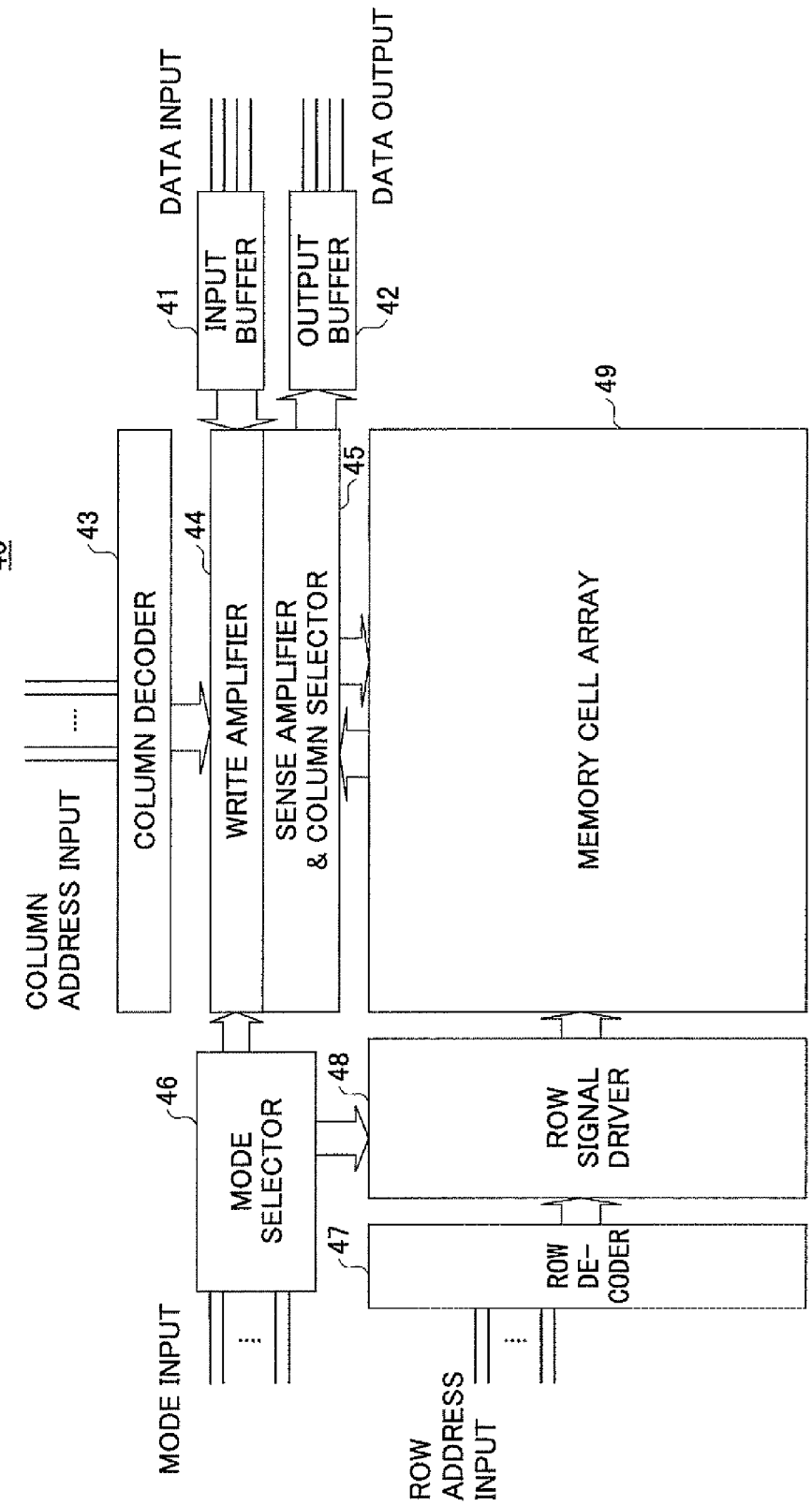

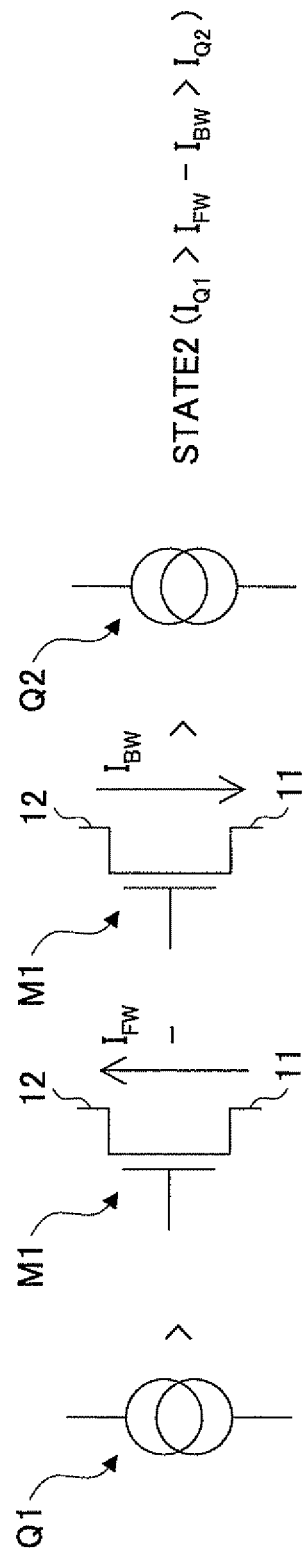

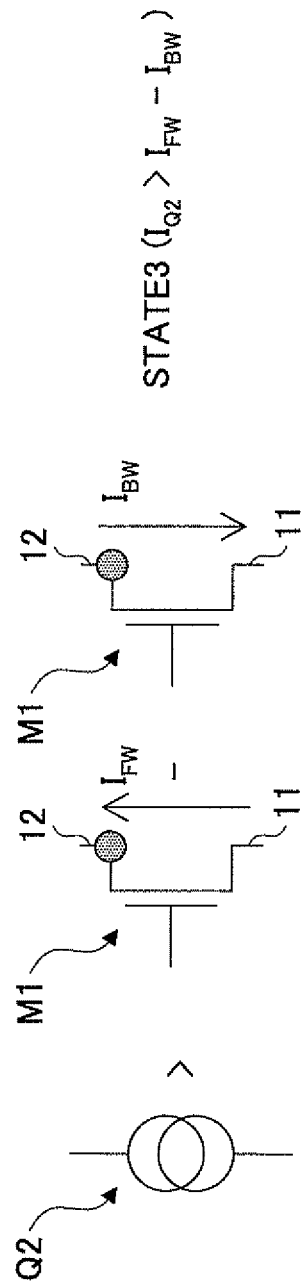

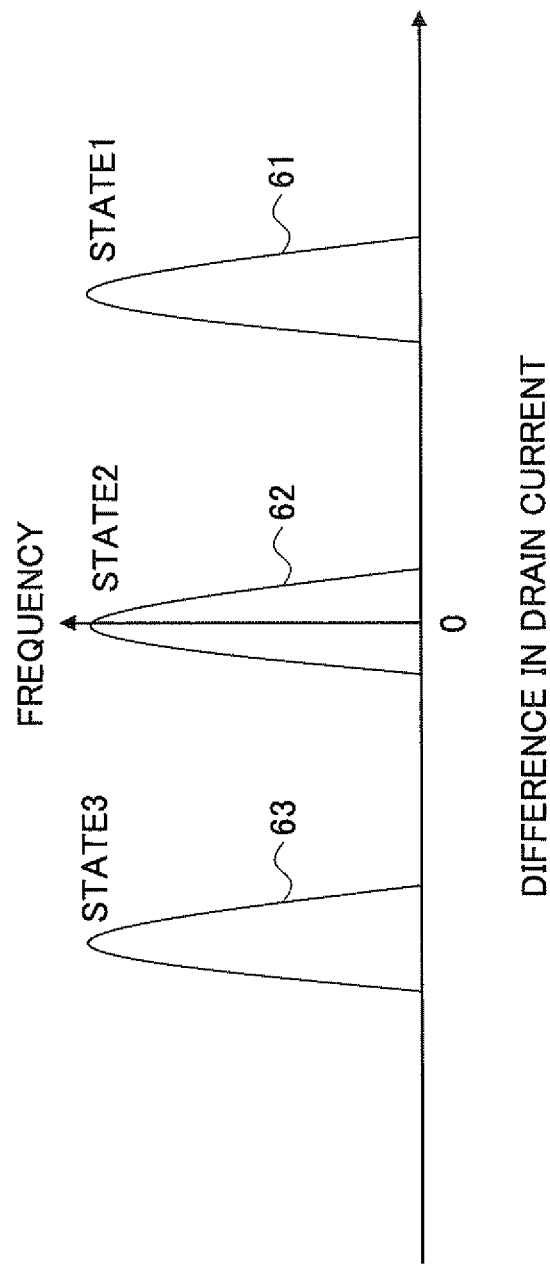

NONVOLATILE SEMICONDUCTOR MEMORY DEVICE USING MIS TRANSISTOR

BACKGROUND OF THE INVENTION

1. Field of the Invention

The disclosures herein generally relate to memory devices, and particularly relate to a nonvolatile memory device.

2. Description of the Related Art

Nonvolatile semiconductor memory devices include flash EEPROMs employing a floating gate structure, FeRAMs employing a ferroelectric film, MRAMs employing a ferromagnetic film, etc. In the case of EEPROMs, there is a need to manufacture a transistor having a special structure comprised of a floating gate. In the case of FeRAMs and MRAMs, which achieve nonvolatile storage by use of a ferroelectric material and a ferromagnetic material, respectively, there is a need to form and process a film made of these respective materials. The need for such a transistor having a special structure and the need for such a film made of a special material are one of the factors that result in an increase in the manufacturing costs.

There is another type of nonvolatile semiconductor memory device, which achieves a nonvolatile data storage function by utilizing an MIS (metal-insulating film-semiconductor) transistor as a memory cell transistor. This MIS transistor has the same structure as ordinary MIS transistors used for conventional transistor functions (e.g., switching function). Namely, this memory cell transistor requires neither a special structure such as a floating gate nor a special material such as a ferroelectric material or a ferromagnetic material. Provision is made such that the MIS transistor utilized as a memory cell transistor experiences a hot-carrier effect on purpose for storage of one-bit data. Here, the hot-carrier effect refers to the injection of electrons into the oxide film. The presence of electrons trapped in the oxide film causes a rise in the threshold voltage, which causes the drain current to be decreased. The amount of drain current of a given MIS transistor may be measured to determine whether this transistor has electrons trapped in the oxide film. The presence of trapped electrons may represent one-bit data "0", for example, and the absence of electrons trapped in the oxide film may represent one-bit data "1", for example.

In order to determine whether a given transistor has electrons trapped in the oxide film, the drain current of the transistor may be compared with a reference current. A drain current smaller than the reference current indicates that there are electrons trapped in the oxide film. However, different MIS transistors have different threshold voltages due to variation in the number of impurities contained in the semiconductor substrate. Because of this, the amount of drain current varies from transistor to transistor. Such variation in the amount of drain current may cause an error in the detection of a stored value. Namely, a transistor having a relatively low threshold voltage from the beginning may be likely to have a relatively low threshold voltage after injection of electrons. Since the drain current of such a transistor is relatively large, the drain current may exceed the reference current, resulting in erroneous data detection.

SUMMARY OF THE INVENTION

According to an embodiment, a nonvolatile semiconductor memory device includes an MIS transistor having nodes, a control circuit configured to apply a first set of potentials to the nodes to cause an irreversible change in transistor characteristics, to apply a second set of potentials to the nodes to cause a first current to flow through the MIS transistor in a first direction, and to apply the second set of potentials to the nodes to cause a second current to flow through the MIS transistor in a second direction opposite the first direction, and a sense circuit configured to produce a signal responsive to a difference between the first current and the second current.

According to an embodiment, a method of reading data from a nonvolatile semiconductor memory device, in which a MIS transistor having experienced a hot carrier effect is used as a memory cell, includes applying a second set of potentials to nodes of the MIS transistor to cause a first current to flow through the MIS transistor in a first direction, applying the second set of potentials to the nodes to cause a second current to flow through the MIS transistor in a second direction opposite the first direction, and producing read data responsive to a difference between the first current and the second current.

BRIEF DESCRIPTION OF THE DRAWINGS

Other objects and further features of the present invention will be apparent from the following detailed description when read in conjunction with the accompanying drawings, in which:

FIGS. 1A and 1B are drawings illustrating two data states according to a first embodiment;

FIG. 2A is a drawing illustrating distributions of drain current;

FIG. 3 is a block diagram illustrating the configuration of a nonvolatile semiconductor memory device according to the embodiment;

FIGS. 7A through 7C are drawings illustrating three data states according to a second embodiment;

FIG. 8 is a drawing illustrating the distributions of differences between a first current $I_{FW}$ and a second current $I_{BW}$;

DESCRIPTION OF THE PREFERRED EMBODIMENTS

Figure 2B:
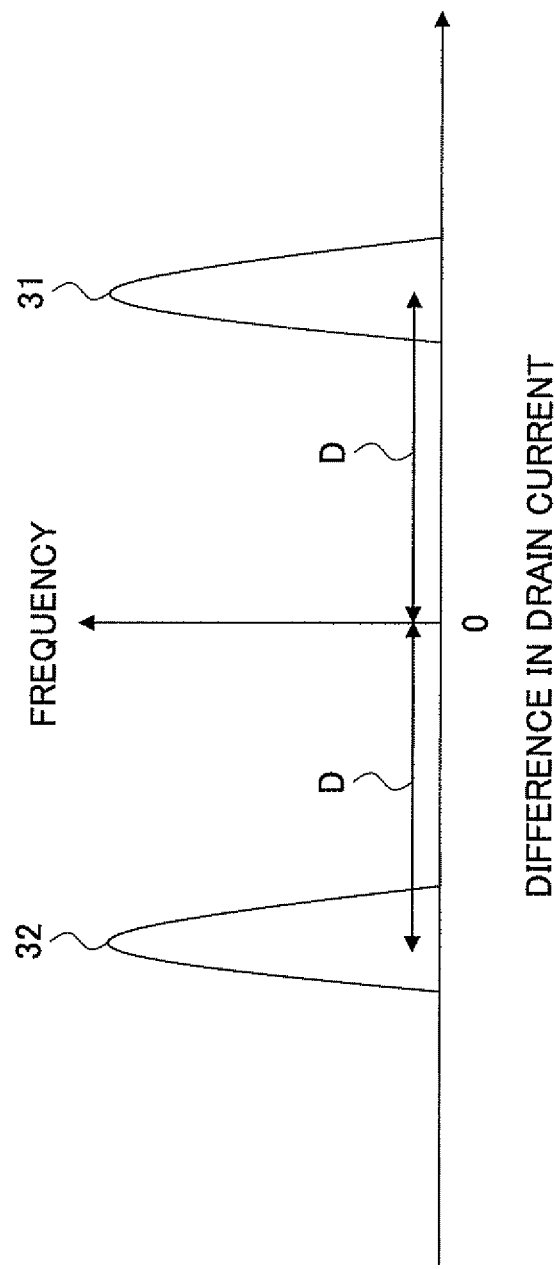
FIG. 2B is a drawing illustrating the distributions of differences between a first current $I_{FW}$ and a second current $I_{BW}$.

In the technology disclosed herein, a memory cell includes a MIS (metal-insulating film-semiconductor) transistor that has the same structure as ordinary MIS transistors used for conventional transistor functions (e.g., switching function). This MIS transistor has substantially the same structure as ordinary MIS transistors used for conventional transistor functions (e.g., switching function). Namely, this memory cell transistor requires neither a special structure such as a floating gate nor a special material such as a ferroelectric material or a ferromagnetic material.

When a certain set of potentials is applied to the gate, source, and drain nodes of a MIS transistor, the MIS transistor may experience a hot carrier effect. Namely, the MIS transistor operating in the saturation region may have the channel thereof pinched off near the drain, so that a strong electric field is applied to the proximity of the drain. Some of the electrons accelerated by this electric field are injected into the oxide film. This causes an irreversible change in the transistor characteristics, which may be a rise in the threshold voltage, i.e., an increase in the channel resistance. It may be noted that such a change in the transistor characteristics caused by a hot-carrier effect is localized around the drain node of the MIS transistor.

In the following, embodiments will be described with reference to the accompanying.

FIGS. 1A and 1B are drawings illustrating two data states according to a first embodiment. In FIG. 1A, an MIS transistor M1 has electrons 13 trapped in the oxide film near a first channel node 11, which is either a drain or a source depending on which direction the electric current flows. In FIG. 1B, the MIS transistor M1 has electrons 14 trapped in the oxide film near a second channel node 12, which is either a drain or a source depending on which direction the electric current flows. The electrons 13 or 14 have been injected through a hot carrier effect to the oxide film in advance by applying a certain set of potentials to the gate, source, and drain nodes of the MIS transistor M1.

In FIG. 1A, a second set of potentials, which is different from the set of potentials used to cause the hot carrier effect, may be applied to the gate, source, and drain nodes of the MIS transistor M1 to cause a first current $I_{FW}$ to flow through the MIS transistor M1 in a first direction. The first channel node 11 serves as the drain node, and the electrons 13 are trapped near the drain node. In this case, the first current $I_{FW}$ is smaller than the current that would be observed without such trapped electrons, but the difference between these two currents is relatively small.

The same set of potentials as the second set of potentials may be applied to the gate, source, and drain nodes of the MIS transistor M1, with the potentials applied to the two channel nodes being swapped. This causes a second current $I_{BW}$ to flow through the MIS transistor M1 in a second direction opposite the first direction. The first channel node 11 serves as the source node, and the electrons 13 are trapped near the source node. In this case, the second current $I_{BW}$ is smaller than the current that would be observed without such trapped electrons, and the difference between these two currents is relatively large.

Consequently, the first current $I_{FW}$ is larger than the second current $I_{BW}$. This condition, i.e., the first current $I_{FW}$ being larger than the second current $I_{BW}$, is denoted as a state STATE1.

In FIG. 1B, the second set of potentials may be applied to the gate, source, and drain nodes of the MIS transistor M1 to cause the first current $I_{FW}$ to flow through the MIS transistor M1 in the first direction. The second channel node 12 serves as the source node, and the electrons 14 are trapped near the source node. In this case, the first current $I_{FW}$ is smaller than the current that would be observed without such trapped electrons, and the difference between these two currents is relatively large.

The same set of potentials as the second set of potentials may be applied to the gate, source, and drain nodes of the MIS transistor M1, with the potentials applied to the two channel nodes being swapped. This causes the second current $I_{BW}$ to flow through the MIS transistor M1 in the second direction opposite the first direction. The second channel node 12 serves as the drain node, and the electrons 14 are trapped near the drain node. In this case, the second current $I_{BW}$ is smaller than the current that would be observed without such trapped electrons, but the difference between these two currents is relatively small.

Consequently, the first current $I_{FW}$ is smaller than the second current $I_{BW}$. This condition, i.e., the first current $I_{FW}$ being smaller than the second current $I_{BW}$, is denoted as a state STATE2.

The MIS transistor M1 described above may be utilized as a memory cell transistor. Namely, the state STATE1 and the state STATE2 may correspond to two different values of binary data retention. The state STATE1 may be treated as "0", for example, and the state STATE2 may be treated as "1", for example. A sense circuit may be provided to produce a signal responsive to a difference between the first current $I_{FW}$ and the second current $I_{BW}$. For example, the difference $I_{FW}-I_{BW}$ may be compared with a certain threshold, which may be zero. The difference that is positive indicates that the MIS transistor M1 is in the state STATE1. The difference that is negative indicates that the MIS transistor M1 is in the state STATE2.

FIG. 2A is a drawing illustrating distributions of drain current. The horizontal axis represents the amount of drain current. The vertical axis represents the frequency of occurrences of drain currents. A distribution 20 indicates the frequency of occurrences of drain currents with respect to MIS transistors with trapped electrons, i.e., with respect to MIS transistors having experienced a hot carrier effect. The distribution 20 may be obtained by counting, separately for each current amount, the number of MIS transistors which exhibit the given current amount and by making a histogram based on the obtained counts. A distribution 21 indicates the frequency of occurrences of drain currents with respect to MIS transistors without trapped electrons, i.e., with respect to MIS transistors having experienced no hot carrier effect.

In a conventional method of determining a stored value, an observed drain current may be compared with a reference current 22. The reference current 22 may be selected such that the position of the reference current is situated between the distribution 20 and the distribution 21 as illustrated in FIG. 2A. An MIS transistor that is situated at a very high end 23 of the distribution exhibits a drain current that is very close to the reference current 22. This may happen when the number of impurities in the semiconductor substrate is at the low end of their distribution range due to variation. Under extreme conditions, this MIS transistor may even exhibit a drain current that is larger than the reference current 22, resulting in erroneous data detection.

In the case of the method of determining a stored value as described in connection with FIGS. 1A and 1B, a difference between the first current $I_{FW}$ and the second current $I_{BW}$ may have a narrow distribution. In FIG. 2A, the distribution 20 may be obtained for the first current $I_{FW}$. A distribution 24 may be obtained for the second current $I_{BW}$. An MIS transistor that exhibits a first current $I_{FW}$ situated at the very high end 23 of the distribution 20 may exhibit a second current $I_{BW}$ situated at a very high end 25 of the distribution 24. This is because the number of impurities in the semiconductor substrate is at the low end of their distribution range due to variation. Accordingly, a difference D between the first current $I_{FW}$ and the second current $I_{BW}$ may be close to a constant value regardless of variation in the number of impurities.

FIG. 2B is a drawing illustrating the distributions of differences between the first current $I_{FW}$ and the second current $I_{BW}$. A distribution 31 indicates the frequency of occurrences of with respect to MIS transistors in the state STATE1 shown in FIG. 1A. A distribution 32 indicates the frequency of occurrences of $I_{FW}-I_{BW}$ with respect to MIS transistors in the state STATE2 shown in FIG. 1B. Because the difference D between the first current $I_{FW}$ and the second current $I_{BW}$ is close to a constant value, each of the distributions 31 and 32 has a very narrow width. Each of the distributions 31 and is at a distance D from the center situated at zero. This distance D corresponds to the difference D illustrated in FIG. 2A.

In this manner, the method of determining a stored value as described in connection with FIGS. 1A and 1B cancels out variation in the drain current caused by variation in the number of impurities. This method can thus achieve reliable data determination despite variation in the drain current.

FIG. 3 is a block diagram illustrating the configuration of a nonvolatile semiconductor memory device according to the embodiment. A semiconductor memory device 40 shown in FIG. 3 includes an input buffer 41, an output buffer 42, a column decoder 43, a write amplifier 44, a sense amplifier & column selector 45, a mode selector 46, a row decoder 47, a row signal driver 48, and a memory cell array 49.

The memory cell array 49 includes a plurality of memory cells arranged in a matrix form, each memory cell being a MIS transistor as described in connection with FIGS. 1A and 1B. The memory cells arranged in the same column are connected to the same bit lines, and the memory cells arranged in the same row are connected to the same word line.

The mode selector 46 receives mode input signals from outside the device, and decodes the mode input signals to determine an operation mode (e.g., a write operation mode or a read operation mode). Control signals responsive to the determined operation mode are supplied to the write amplifier 44, the sense amplifier & column selector 45, the row signal driver 48, etc., for control of the individual parts of the semiconductor memory device 40.

The column decoder 43 receives a column address input from outside the device, and decodes the column address input to determine a selected column. The decode signals indicative of the selected column are supplied to the write amplifier 44 and the sense amplifier & column selector 45.

The row decoder 47 receives a row address input from outside the device, and decodes the row address input to determine a selected row. The decode signals indicative of the selected row are supplied to the row signal driver 48.

In response to the control signals from the mode selector 46 and the decode signals from the row decoder 47, the row signal driver 48 activates a selected word line among the word lines extending from the row signal driver 48. These word lines are connected to the gate nodes of the MIS transistors arranged in the memory cell array 49. As a result of the activation of the selected word line, the activation potential is applied to the gates of the MIS transistors (i.e., memory cell transistors) arranged on the selected row. With the application of the activation potential, the writing/reading of data to/from a memory cell transistor is performed.

In response to the control signals from the mode selector 46 and the decode signals from the column decoder 43, the sense amplifier & column selector 45 couples bit lines corresponding to the selected column to a predetermined potential and a first capacitor. Through this coupling, the first current $I_{FW}$ charges the first capacitor. Moreover, the sense amplifier & column selector 45 couples the bit lines corresponding to the selected column to the predetermined potential and a second capacitor. Through this coupling, the second current $I_{BW}$ charges the second capacitor. The sense amplifier & column selector 45 then produces read data responsive to a difference between the voltage across the first capacitor and the voltage across the second capacitor. The read data are output from the output buffer 42 to outside the device as output data.

Input data supplied to the input buffer 41 are provided to the write amplifier 44. In response to the input data, the write amplifier 44 supplies a predetermined write potential and a ground potential to the sense amplifier & column selector 45. The column selector part of the sense amplifier & column selector 45 couples the bit lines corresponding to the selected column to the predetermined write potential and the ground potential provided by the write amplifier 44. Through this coupling, a current flows through the selected MIS transistor in a direction that is responsive to the value of the input data. Electrons are injected to the oxide film of the selected MIS transistor near the drain due to a hot carrier effect.

Figure 4:
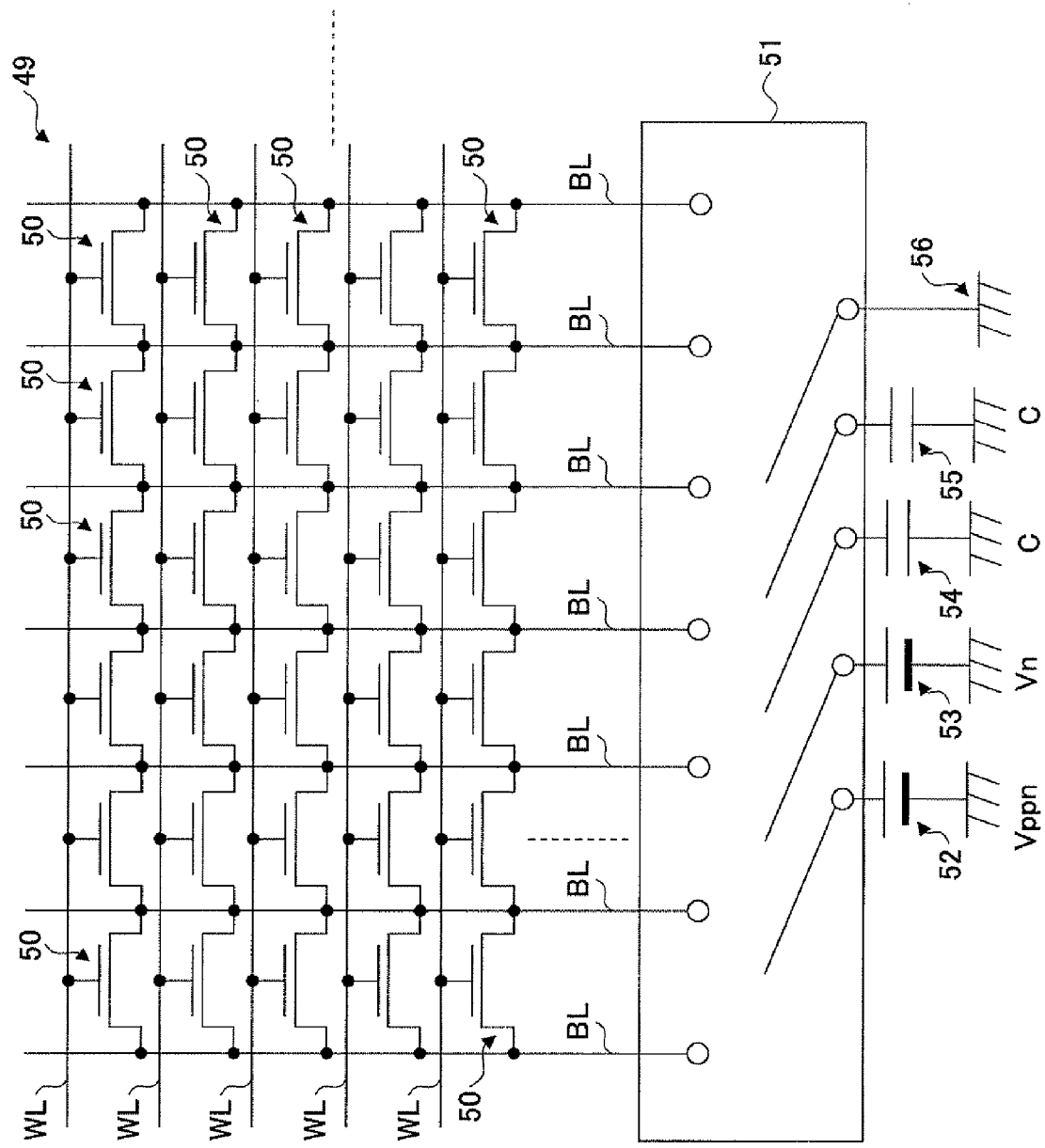
FIG. 4 is an illustrative drawing showing the configuration of a memory cell array together with relevant parts of a write amplifier and a sense amplifier & column selector.

FIG. 4 is an illustrative drawing showing the configuration of the memory cell array 49 together with relevant parts of the write amplifier and the sense amplifier & column selector 45. The memory cell array 49 includes a plurality of MIS transistors 50 arranged in a matrix form. Word lines WL extending from the row signal driver 48 are connected to the gate nodes of the MIS transistors 50. The gate nodes of the MIS transistors 50 arranged in the same row are connected to the same word line WL. Each of the MIS transistors 50 has a drain node thereof connected to a bit line BL, and has a source node thereof connected to a next bit line BL. The bit lines BL extending through the memory cell array 49 are connected to a column selector 51, which is part of the sense amplifier & column selector 45.

The column selector 51 includes switch circuits, which couple a selected pair of bit lines BL to two items selected from a write potential 52 denoted as Vppn, a read potential 53 denoted as Vn, a capacitor 54 having a capacitance of C, a capacitor 55 having a capacitance of C, and a ground potential 56. The write potential 52 and the ground potential 56 may be provided by the write amplifier 44. The read potential 53, the capacitor 54, the capacitor 55, and the ground potential 56 may be provided by or included in the sense amplifier part of the sense amplifier & column selector 45. The switching operation of the column selector 51 is controlled based on both the decode signals supplied from the column decoder 43 and the control signals supplied from the mode selector 46.

Figure 5A:
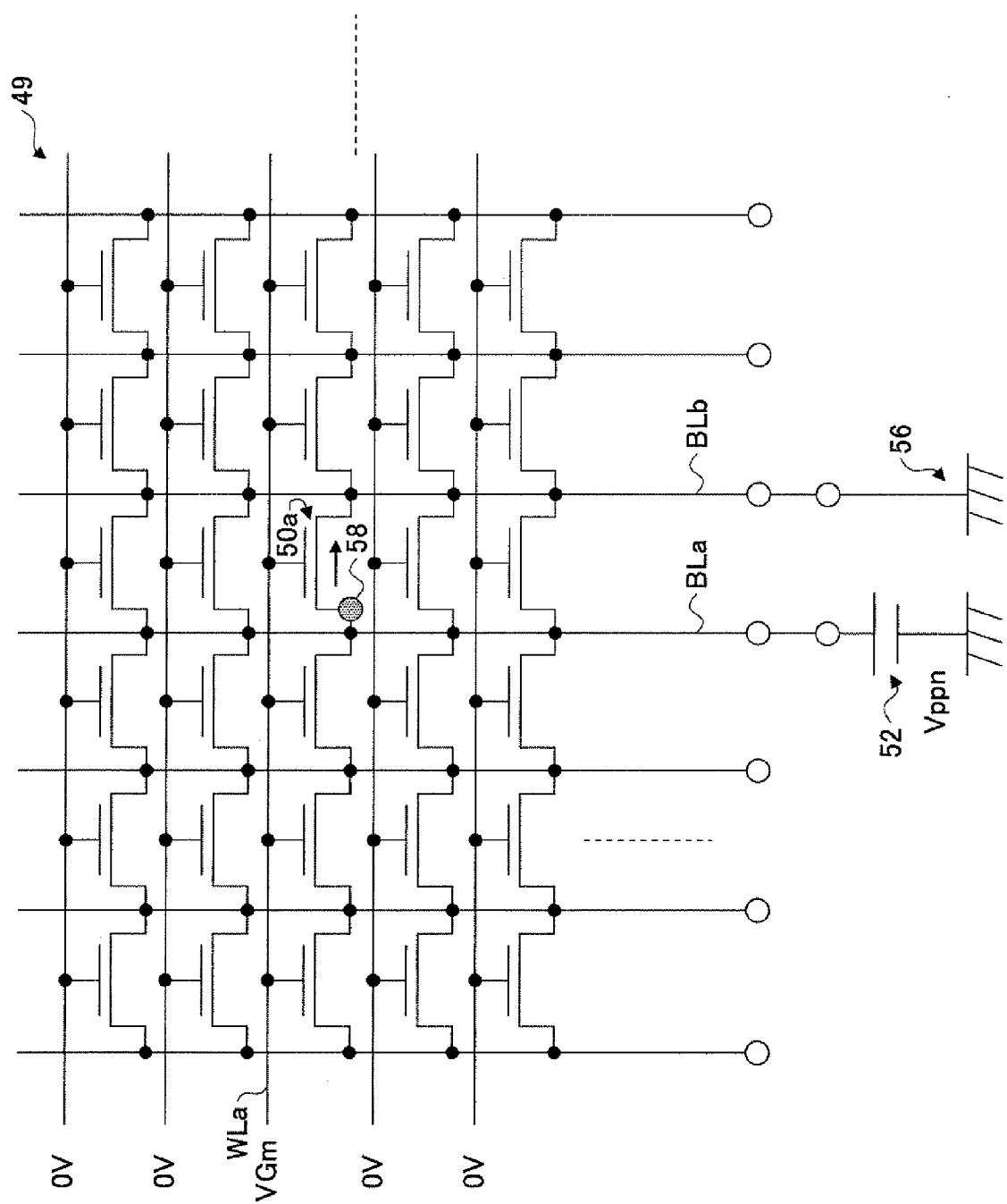
FIGS. 5A and 5B are drawings illustrating write operations.
Figure 5B:
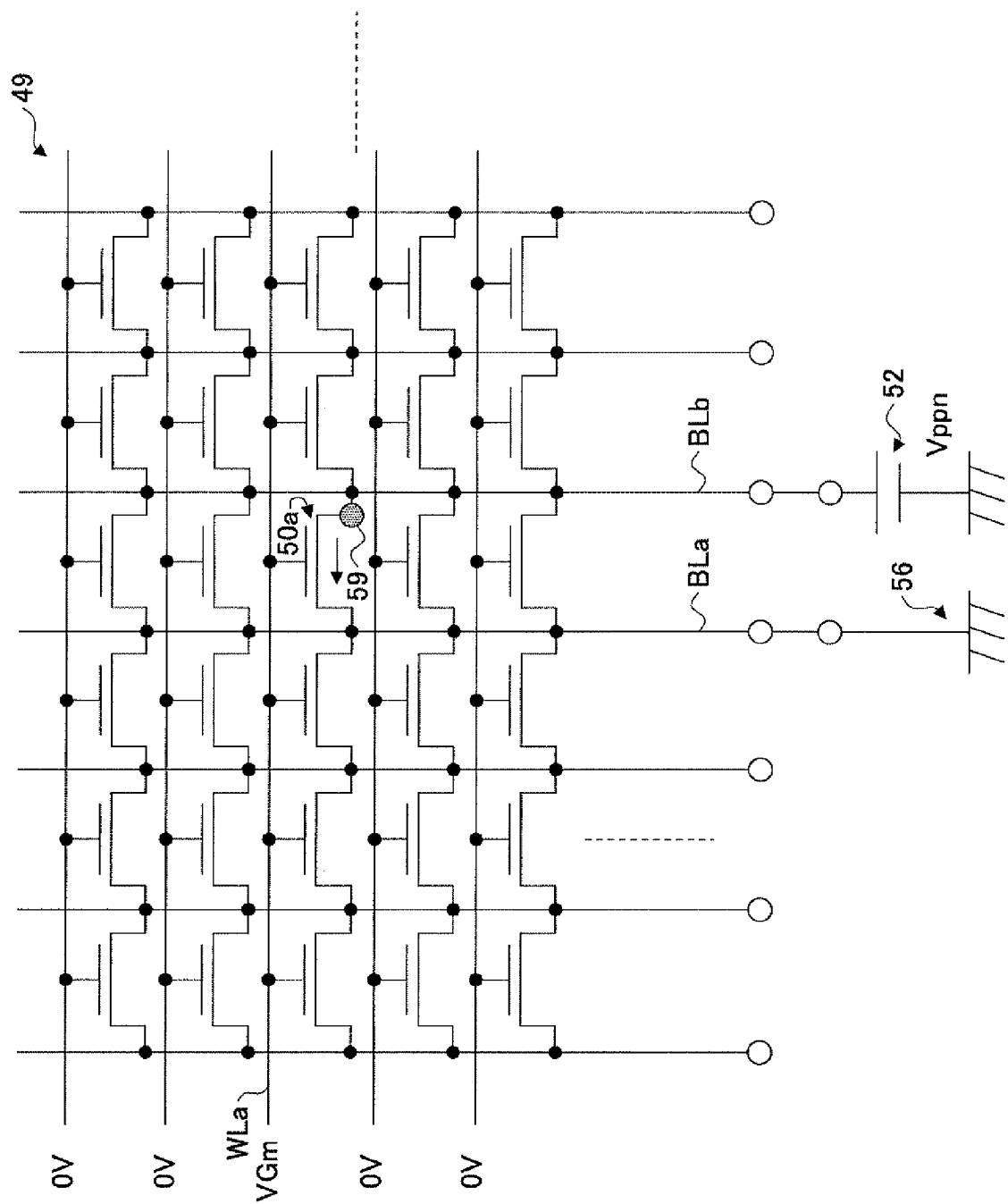

FIGS. 5A and 5B are drawings illustrating write operations. In FIGS. 5A and 5B, the same elements as those of FIG. 4 are referred to by the same numerals, and a description thereof will be omitted. In a write operation, a control circuit that includes the write amplifier 44 (FIG. 3), the row signal driver 48 (FIG. 3), and the column selector 51 (FIG. 4) applies a first set of potentials to the gate, drain, and source nodes of a selected MIS transistor 50a to cause an irreversible change in the transistor characteristics. The first set of potentials includes a gate potential VGm, a write potential Vppn, and the ground potential. The gate potential VGm may be 5 V, for example. The write potential Vppn may be 5 V, for example. The ground potential is 0 V.

In FIG. 5A, the row signal driver 48 sets a selected word line WLa to VGm, and sets the remaining word lines to 0 V. Through the couplings provided by the column selector 51, selected bit lines BLa and BLb are coupled to Vppn and the ground potential, respectively. Vppn and the ground potential are provided by the write amplifier 44 in response to an input data bit, so that which one of the bit lines BLa and BLb is connected to Vppn depends on whether the input data bit is "0" or "1". That is, the direction of a current flowing through the selected MIS transistor 50a depends on whether the input data bit is "0" or "1". In the case of FIG. 5A, the input data bit is "0", for example, and a current flows through the selected MIS transistor 50a from the bit line BLa toward the bit line BLb. This results in electrons 58 trapped near the channel node connected to the bit line BLa.

In the case of FIG. 5B, the input data bit is "1", for example, which is different from the input data bit "0" used in FIG. 5A. The write amplifier 44 thus swaps the position of Vppn and the position of the ground potential relative to their positions appearing in the case of FIG. 5A. The selected bit lines BLa and BLb are thus coupled to the ground potential and Vppn, respectively. A current flows through the selected MIS transistor 50a from the bit line BLb toward the bit line BLa. This results in electrons 59 trapped near the channel node connected to the bit line BLb.

Figure 6A:
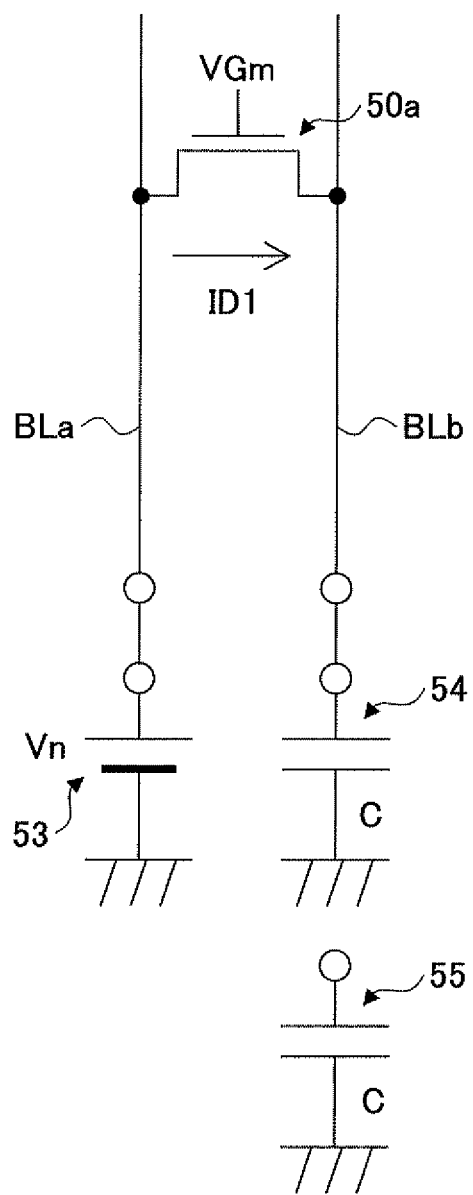
FIGS. 6A through 6C are drawings illustrating a read operation.
Figure 6B:
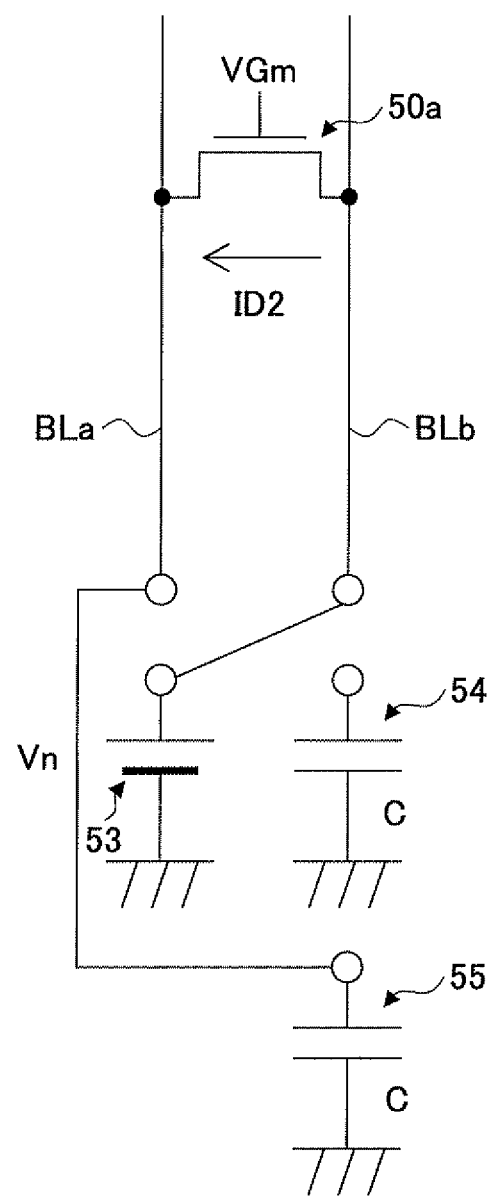
Figure 6C:
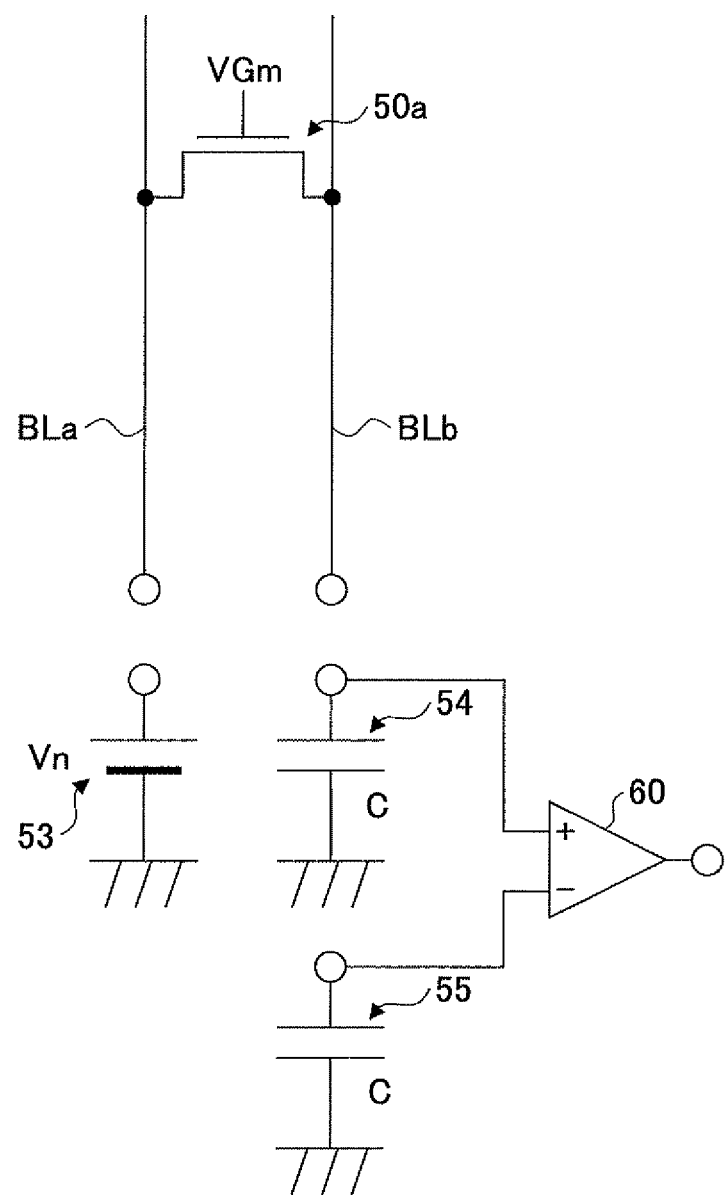

FIGS. 6A through 6C are drawings illustrating a read operation. In FIGS. 6A through 6C, the same elements as those of FIG. 4 and FIGS. 5A and 5B are referred to by the same numerals, and a description thereof will be omitted.

In FIG. 6A, under the control of the control circuit (i.e., the write amplifier 44, the row signal driver 48, and the column selector 51), a second set of potentials is applied to the gate, drain, and source nodes to cause a first current ID1 to flow through the selected MIS transistor 50a in a first direction. The second set of potentials includes a gate potential VGm, a read potential Vn, and the ground potential. The gate potential VGm in the read operation may be 1.8 V, for example. The read potential Vn may be 3 V, for example. The ground potential is 0 V. The row signal driver 48 (FIG. 3) sets a selected word line to VGm, thereby applying VGm to the gate of the selected MIS transistor 50a. Further, through the couplings provided by the column selector 51 (FIG. 3), the selected bit lines BLa and BLb are coupled to the read potential Vn and the capacitor 54, respectively. This connection state may be maintained for a short period of time such that the capacitor 54 is charged by the first current ID1 while the first current ID1 remains constant. As a result, the capacitor 54 is charged to a voltage that is proportional to the first current ID1.

In FIG. 6B, under the control of the control circuit (i.e., the write amplifier 44, the row signal driver 48, and the column selector 51), the second set of potentials is applied to the gate, drain, and source nodes to cause a second current ID2 to flow through the selected MIS transistor 50a in a second direction. The second set of potentials includes the gate potential VGm, the read potential Vn, and the ground potential. Through the couplings provided by the column selector 51 (FIG. 3), the selected bit lines BLa and BLb are coupled to the capacitor 55 and the read potential Vn, respectively. The capacitor 55 has the same capacitance C as the capacitor 54. This connection state may be maintained for the same period of time as in the case of FIG. 6A, such that the capacitor 55 is charged by the second current ID2 while the second current ID2 remains constant. As a result, the capacitor 55 is charged to a voltage that is proportional to the second current ID2.

In FIG. 6C, the sense amplifier part of the sense amplifier & column selector 45 (FIG. 3) includes a differential amplifier 60, and couples the two input nodes of the differential amplifier 60 to the capacitor 54 and the capacitor 55, respectively. The differential amplifier 60 compares the voltage across the capacitor 54 and the voltage across the capacitor 55. The output of the differential amplifier 60 is responsive to the voltage across the capacitor 54 minus the voltage across the capacitor 55. In this manner, the differential amplifier 60 produces an output signal responsive to a difference between the first current ID1 and the second current ID2. This output signal serves as read data, which is then supplied from the sense amplifier & column selector 45 to outside the semiconductor memory device 40 via the output buffer 42.

Figure 7A:
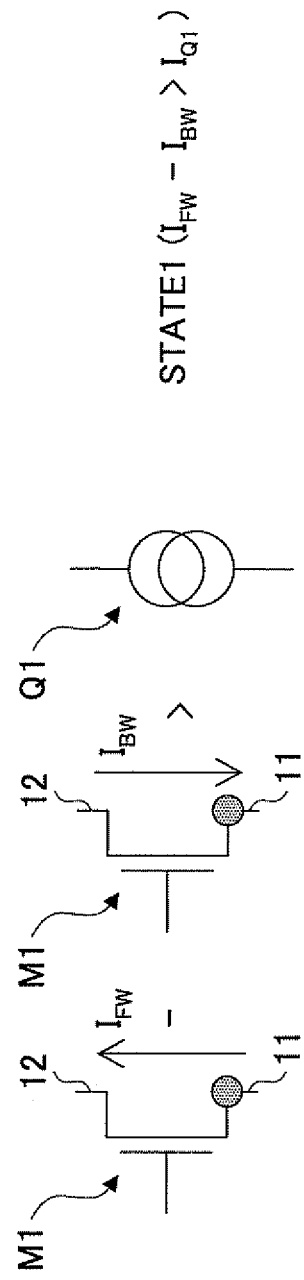

FIGS. 7A through 7C are drawings illustrating three data states according to a second embodiment. In FIGS. 7A through 7C, the same elements as those of FIGS. 1A and 1B are referred to by the same numerals, and a description thereof will be omitted.

In FIG. 7A, electrons are trapped near the first channel node 11 as in FIG. 1A. Further, the operating conditions of the MIS transistor M1 are the same as those of the MIS transistor M1 illustrated in FIG. 1A. In this case, the first current $I_{FW}$ is larger than the second current $I_{BW}$. Unlike the case illustrated in FIG. 1A, a state STATE1 in FIG. 7A is defined as the condition in which the first current $I_{FW}$ minus the second current $I_{BW}$ is larger than a first reference current $I_{Q1}$, which is provided by a first current source Q1.

In FIG. 7C, electrons are trapped near the second channel node 12 as in FIG. 1B. Further, the operating conditions of the MIS transistor M1 are the same as those of the MIS transistor M1 illustrated in FIG. 1B. In this case, the first current $I_{FW}$ is smaller than the second current $I_{BW}$. In FIG. 7C, a state STATE3 is defined as the condition in which the first current $I_{FW}$ minus the second current $I_{BW}$ is smaller than a second reference current $I_{Q2}$, which is provided by a second current source Q2. Here, second reference current $I_{Q2}$ assumes a negative value.

In FIG. 7B, no electron is trapped near the first channel node 11 or the second channel node 12. In this case, the first current $I_{FW}$ is substantially the same as the second current $I_{BW}$. In FIG. 7B, a state STATE2 is defined as the condition in which the first current $I_{FW}$ minus the second current $I_{BW}$ is smaller than the first reference current $I_{Q1}$, and larger than the second reference current $I_{Q2}$.

It may be noted that the state STATE2 may also correspond to the condition in which electrons are trapped near the first channel node 11 and also trapped near the second channel node 12. Especially, when the amount of electrons trapped near the first channel node 11 is substantially the same as the amount of electrons trapped near the second channel node 12, the first current $I_{FW}$ may become substantially the same as the second current $I_{BW}$. In this manner, the state STATE2 corresponds to both the case in which no electrons are trapped and the case in which electrons are trapped near each of the two channel nodes.

FIG. 8 is a drawing illustrating the distributions of differences between the first current $I_{FW}$ and the second current $I_{BW}$. A distribution 61 indicates the frequency of occurrences of $I_{FW}-I_{BW}$ with respect to MIS transistors in the state STATE1 shown in FIG. 7A. A distribution 62 indicates the frequency of occurrences of $I_{FW}-I_{BW}$ with respect to MIS transistors in the state STATE2 shown in FIG. 7B. A distribution 63 indicates the frequency of occurrences of $I_{FW}-I_{BW}$ with respect to MIS transistors in the state STATE3 shown in FIG. 7C. Because a difference between the first current $I_{FW}$ and the second current $I_{BW}$ is close to a constant value for each of the three states, each of the distributions 61 through 63 has a very narrow width. Accordingly, three-valued data can be stored and reliably read by detecting one of the three states STATE1 through STATE3 in which the MIS transistor M1 is placed.

Figure 9A:
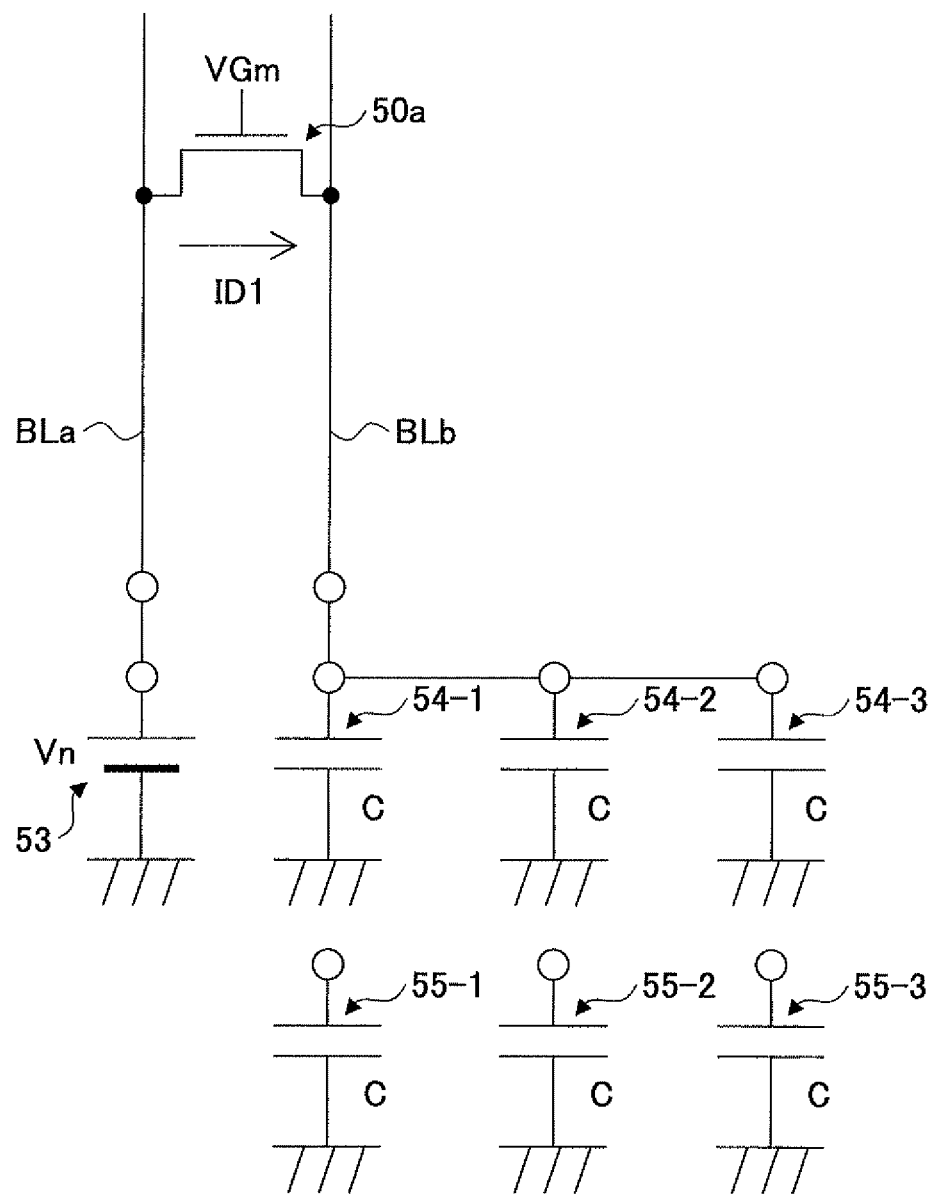
FIGS. 9A and 9B are drawings illustrating a first part of a read operation according to the second embodiment.
Figure 9B:
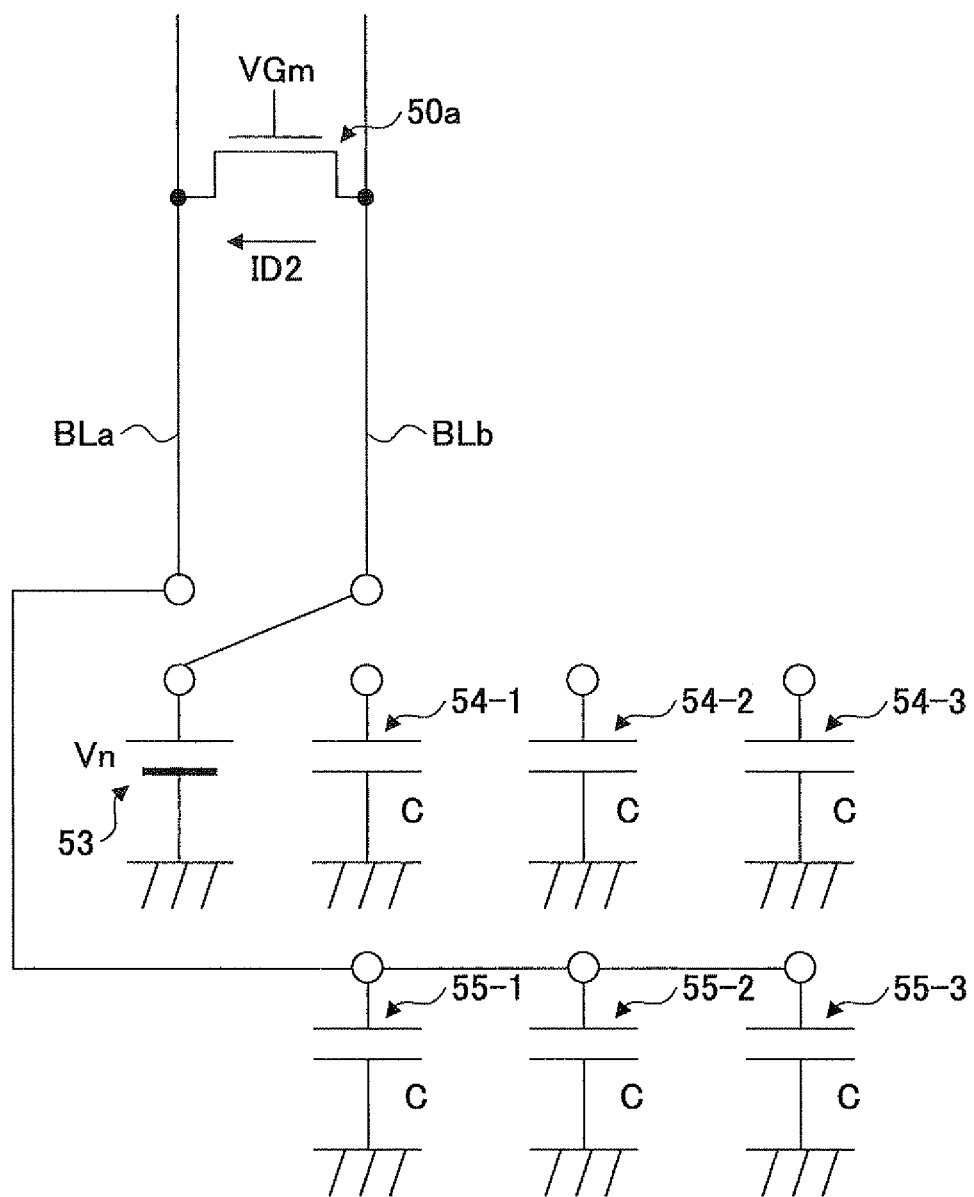

FIGS. 9A and 9B are drawings illustrating a first part of a read operation according to the second embodiment. In the first part of the read operation, capacitors are charged by drain currents. In FIGS. 9A and 9B, the same elements as those of FIG. 4 and FIGS. 5A and 5B are referred to by the same numerals, and a description thereof may be omitted. The configuration of the semiconductor memory device according to the second embodiment is the same as the configuration illustrated in FIG. 3. The configuration of the memory cell array 49 according to the second embodiment is the same as the memory cell array 49 illustrated in FIG. 4. In the second embodiment, however, the number of capacitors used in the read operation and the control procedure of the read operation are different from those of the first embodiment. In the second embodiment, six capacitors 54-1 through 54-3 and 55-1 through 55-3 are used in the read operation.

In FIG. 9A, under the control of the control circuit (i.e., the write amplifier 44, the row signal driver 48, and the column selector 51), a second set of potentials is applied to the gate, drain, and source nodes to cause a first current ID1 to flow through the selected MIS transistor 50a in a first direction. The second set of potentials includes a gate potential VGm, a read potential Vn, and the ground potential. The gate potential VGm in the read operation may be 1.8 V, for example. The read potential Vn may be 3 V, for example. The ground potential is 0 V. The row signal driver 48 (FIG. 3) sets a selected word line to VGm, thereby applying VGm to the gate of the selected MIS transistor 50a. Further, through the couplings provided by the column selector 51 (FIG. 3), the selected bit lines BLa and BLb are coupled to the read potential Vn and the capacitors 54-1 through 54-3, respectively. The capacitors 54-1 through 54-3 have the same capacitance C. This connection state may be maintained for a short period of time such that the capacitors 54-1 through 54-3 are charged by the first current ID1 while the first current ID1 remains constant. As a result, the capacitors 54-1 through 54-3 are charged to a voltage that is proportional to the first current ID1.

In FIG. 9B, under the control of the control circuit (i.e., the write amplifier 44, the row signal driver 48, and the column selector 51), the second set of potentials is applied to the gate, drain, and source nodes to cause a second current ID2 to flow through the selected MIS transistor 50a in a second direction. The second set of potentials includes the gate potential VGm, the read potential Vn, and the ground potential. Through the couplings provided by the column selector 51 (FIG. 3), the selected bit lines BLa and BLb are coupled to the capacitors 55-1 through 55-3 and the read potential Vn, respectively. The capacitors 55-1 through 55-3 have the same capacitance C as the capacitors 54-1 through 54-3. This connection state may be maintained for the same period of time as in the case of FIG. 9A, such that the capacitors 55-1 through 55-3 are charged by the second current ID2 while the second current ID2 remains constant. As a result, the capacitors 55-1 through 55-3 are charged to a voltage that is proportional to the second current ID2.

Figure 10A:
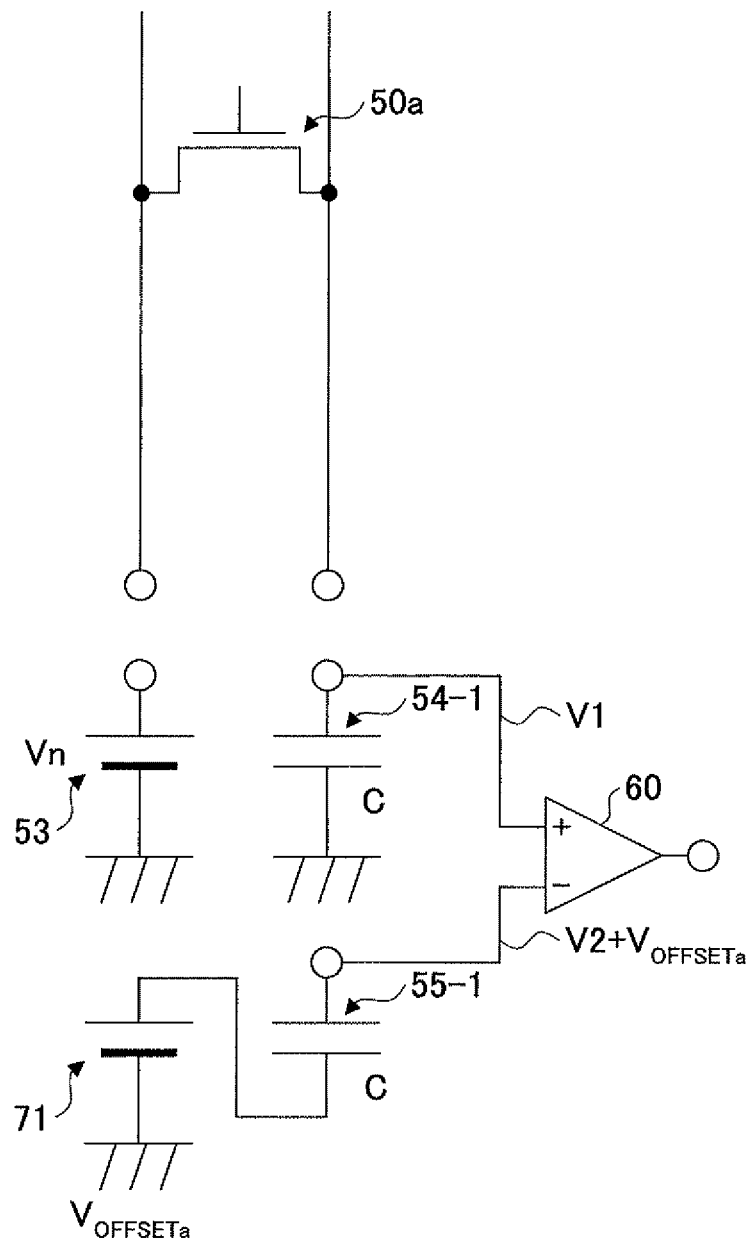
FIGS. 10A through 10C are drawings illustrating a second part of the read operation according to the second embodiment.
Figure 10B:
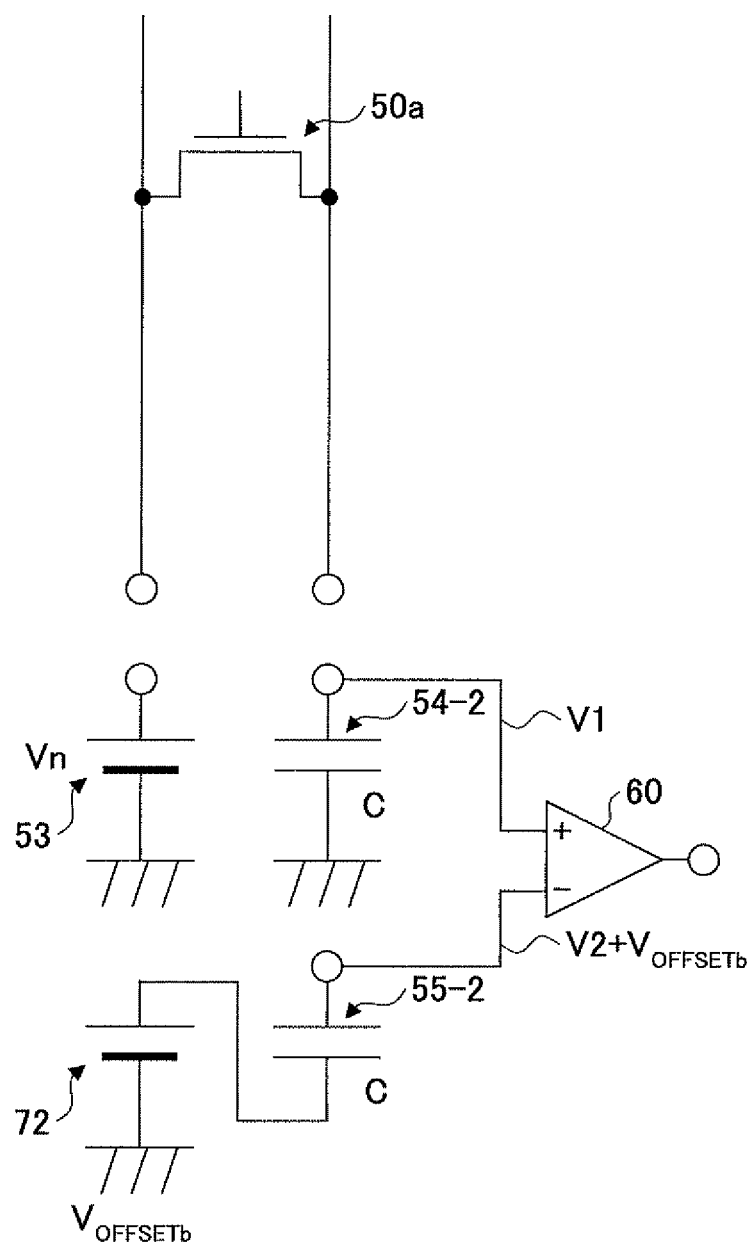

FIGS. 10A and 10B are drawings illustrating a second part of the read operation according to the second embodiment. In the second part of the read operation, voltages stored in the capacitors are subjected to comparison. In FIGS., 10A and 10B, the same elements as those of FIGS. 9A and 9B are referred to by the same numerals, and a description thereof may be omitted.

In FIG. 10A, the sense amplifier part of the sense amplifier & column selector 45 (FIG. 3) couples the two input nodes of the differential amplifier 60 to the capacitor 54-1 and the capacitor 55-1, respectively. The capacitor 55-1 is biased by a reference voltage 71 which is equal to $V_{OFFSETa}$. The differential amplifier 60 compares voltage V1 across the capacitor 54-1 with voltage V2 across the capacitor 55-1 plus $V_{OFFSETa}$. The output of the differential amplifier 60 is set to 1 in the case of V1−V2−$V_{OFFSETa}$>0, and is set to 0 in the case of V1−V2−$V_{OFFSETa}$<0. In other words, this output indicates whether the condition of V1−V2>$V_{OFFSETa}$ is satisfied, which is equivalent to whether the state STATE1 illustrated in FIG. 7A is satisfied. In the case of the state STATE1 being satisfied, read data indicative of the state STATE1 are supplied from the sense amplifier & column selector 45 to outside the semiconductor memory device 40 via the output buffer 42.

In FIG. 10B, the sense amplifier part of the sense amplifier & column selector 45 (FIG. 3) couples the two input nodes of the differential amplifier 60 to the capacitor 54-2 and the capacitor 55-2, respectively. The capacitor 55-2 is biased by a reference voltage 72 which is equal to $V_{OFFSETb}$. Here, $V_{OFFSETb}$ may be a negative voltage. The differential amplifier 60 compares voltage V1 across the capacitor 54-2 with voltage V2 across the capacitor 55-2 plus $V_{OFFSETb}$. The output of the differential amplifier 60 is set to 1 in the case of V1−V2−$V_{OFFSETb}$>0, and is set to 0 in the case of V1−V2−$V_{OFFSETb}$<0. In other words, this output indicates whether the condition of V1−V2<$V_{OFFSETb}$ is satisfied, which is equivalent to whether the state STATE3 illustrated in FIG. 7C is satisfied. In the case of the state STATE3 being satisfied, read data indicative of the state STATE3 are supplied from the sense amplifier & column selector 45 to outside the semiconductor memory device 40 via the output buffer 42.

If neither the state STATE1 nor the state STATE3 described above is satisfied, then, the state of the MIS transistors 50 is determined to be the state STATE2 illustrated in FIG. 7B. Read data indicative of the state STATE2 are then supplied from the sense amplifier & column selector 45 to outside the semiconductor memory device 40 via the output buffer 42.

According to the second embodiment described above, tertiary data (i.e., three-valued data) can be written to and reliably read from a selected MIS transistor. In a variation of the second embodiment, four-valued data may be written to and reliably read from a selected MIS transistor. The fourth value may be detected by determining whether the state STATE2 corresponds to the absence of trapped electrons with respect to both channel nodes or corresponds to the presence of trapped electrons with respect to both channel nodes.

Figure 10C:
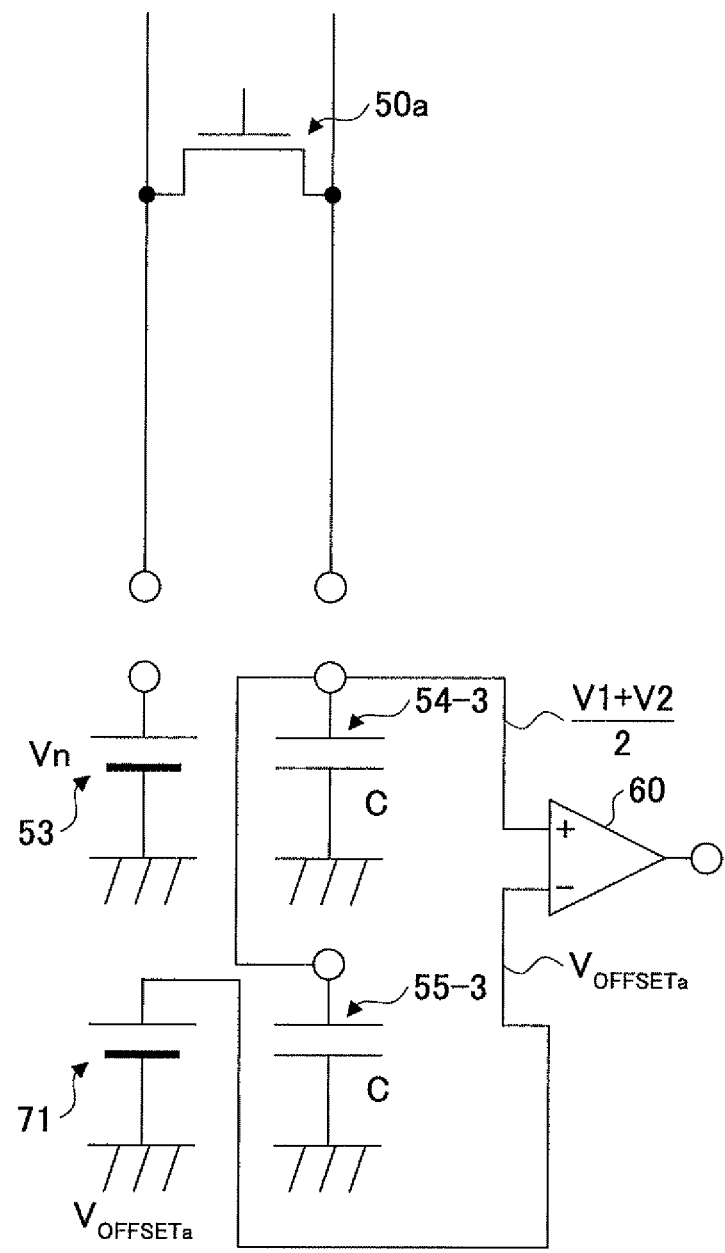

In FIG. 10C, the sense amplifier part of the sense amplifier & column selector 45 (FIG. 3) couples the two input nodes of the differential amplifier 60 to the capacitors 54-3 and 55-3 and the reference voltage 71 which is equal to $V_{OFFSETa}$. The differential amplifier 60 compares $V_{OFFSETa}$ with an average of voltage V1 across the capacitor 54-3 and voltage V2 across the capacitor 55-3. The output of the differential amplifier 60 is set to 1 in the case of (V1+V2)/2−$V_{OFFSETa}$>0, and is set to 0 in the case of (V1+V2)/2−$V_{OFFSETa}$<0. In other words, this output indicates whether the condition of (V1+V2)/2>$V_{OFFSETa}$ is satisfied. This condition is satisfied if no trapped electron is in existence (i.e., if the drain currents are relatively large). This condition is not satisfied if trapped electrons are in existence with respect to both the channel nodes (i.e., if the drain currents are relatively small).

In this manner, the state STATE2 can be classified into a state STATE2a indicative of the absence of trapped electrons and a state STATE2b indicative of the presence of trapped electrons. Since a difference in the drain currents between these two states is sufficiently large, the use of a reference voltage in the manner described above does not give rise to the problem of erroneous detection. In the variation of the second embodiment, read data indicative of the state STATE2a or STATE2b are then supplied from the sense amplifier & column selector 45 to outside the semiconductor memory device 40 via the output buffer 42. It may be noted that the reference voltage $V_{OFFSETa}$ used in the above-described operation may not be the same as the reference voltage for detecting the state STATE1. Namely, the reference voltage for detecting the state STATE2a and the state STATE2b may be a different voltage than $V_{OFFSETa}$.

In this manner, the four states STATE1, STATE2a, STATE2b, and STATE3 may be stored in and reliably read from a selected MIS transistor. It may be noted that in FIG. 100, (V1+V2)/2 is compared with $V_{OFFSETa}$. The use of such an average value may provide improved robustness against noise. Notwithstanding this, a voltage across one transistor may be compared with $V_{OFFSETa}$ as described below.

Figure 11:
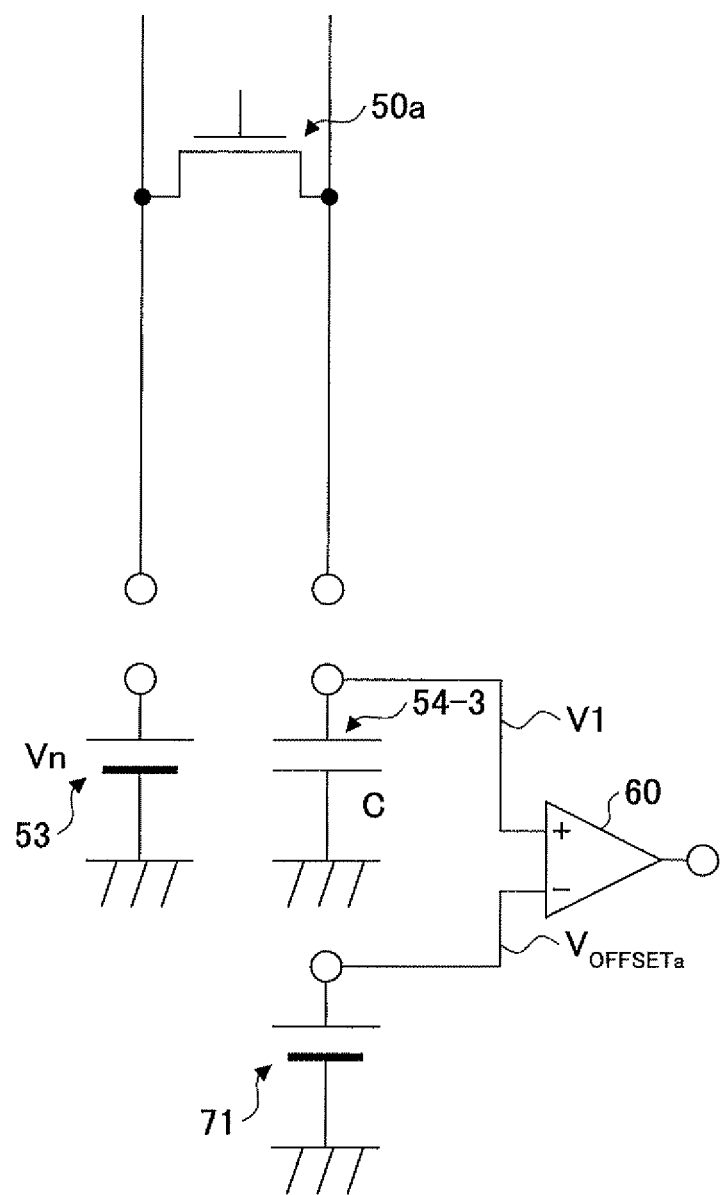
FIG. 11 is a drawing illustrating the operation of comparing a voltage across a capacitor with a reference voltage.

FIG. 11 is a drawing illustrating the operation of comparing a voltage across a capacitor with a reference voltage. In FIG. 11, the same elements as those of FIG. 100 are referred to by the same numerals, and a description thereof will be omitted. In this configuration, the output of the differential amplifier 60 is set to 1 in the case of $V1-V_{OFFSETa}>0$, and is set to 0 in the case of $V1-V_{OFFSETa}<0$. In other words, this output indicates whether the condition of $V1>V_{OFFSETa}$ is satisfied. This condition is satisfied if no trapped electron is in existence (i.e., if the drain currents are relatively large). This condition is not satisfied if trapped electrons are in existence with respect to both the channel nodes (i.e., if the drain currents are relatively small). In this manner, the state STATE2 can be classified into a state STATE2a indicative of the absence of trapped electrons and a state STATE2b indicative of the presence of trapped electrons.

Further, the present invention is not limited to these embodiments, but various variations and modifications may be made without departing from the scope of the present invention.

What is claimed is:

1. A nonvolatile semiconductor memory device, comprising:
   an MIS transistor having nodes that are a gate node, a first drain/source node, and a second drain/source node;
   a control circuit configured to apply a first set of potentials to the nodes to cause an irreversible change in transistor characteristics, to apply a second set of potentials to the nodes in a first operation to cause a first current to flow through the MIS transistor in a first direction, and to apply the second set of potentials to the nodes in a second operation, with potentials applied to the first and second drain/source nodes being swapped from the first operation, to cause a second current to flow through the MIS transistor in a second direction opposite the first direction;
   a first capacitor connected to the MIS transistor during the first operation to be charged with the first current;
   a second capacitor connected to the MIS transistor during the second operation to be charged with the second current; and
   a sense circuit connected to the first and second capacitors and configured to produce a signal responsive to a difference between the first current and the second current.

2. The nonvolatile semiconductor memory device as claimed in claim 1, wherein the signal produced by the sense circuit is responsive to a comparison of the difference with at least one threshold value.

3. The nonvolatile semiconductor memory device as claimed in claim 1, wherein the signal produced by the sense circuit has a binary value responsive to whether the first current is larger than the second current.

4. The nonvolatile semiconductor memory device as claimed in claim 1, wherein the signal produced by the sense circuit indicates three values responsive to comparisons of the difference with two threshold values.

5. The nonvolatile semiconductor memory device as claimed in claim 1, wherein the signal produced by the sense circuit indicates four values, three of which are responsive to comparisons of the difference with two threshold values, a remaining one of the four values being responsive to a comparison of one of the first current and the second current with a threshold value.

6. The nonvolatile semiconductor memory device as claimed in claim 1, wherein the signal produced by the sense circuit indicates four values, three of which are responsive to comparisons of the difference with two threshold values, a remaining one of the four values being responsive to a comparison of an average or sum of the first current and the second current with a threshold value.

7. The nonvolatile semiconductor memory device as claimed in claim 1, wherein the sense circuit includes
   a differential amplifier having two input nodes thereof coupled to the first capacitor and the second capacitor, respectively, to produce the signal responsive to the difference between the first current and the second current.

8. A method of reading data from a nonvolatile semiconductor memory device in which a MIS transistor having experienced a hot carrier effect is used as a memory cell, the method comprising:
   applying a set of potentials to a gate node, a first drain/source node, and a second drain/source node of the MIS transistor in a first operation to cause a first current to flow through the MIS transistor in a first direction;
   charging a first capacitor with the first current;
   applying the set of potentials to the gate node, the first drain/source node, and the second drain/source node in a second operation, with potentials applied to the first and second drain/source nodes being swapped from the first operation, to cause a second current to flow through the MIS transistor in a second direction opposite the first direction;
   charging a second capacitor with the second current;
   producing read data responsive to a difference between the first current and the second current based on a difference between a voltage across the first capacitor and a voltage across the second capacitor.

9. The method as claimed in claim 8, wherein the step of producing read data produces the read data by comparing the difference with a threshold value.

10. The method as claimed in claim 8, wherein the step of producing read data produces the read data by comparing the difference with two threshold values.

* * * * *